United States Patent
Schneider et al.

(10) Patent No.: US 8,983,801 B2
(45) Date of Patent: Mar. 17, 2015

(54) METHOD AND SYSTEM FOR TRANSFORMING A CAD MODEL OF AN OBJECT BETWEEN ENGINEERING STATES

(75) Inventors: Thomas Kurt Schneider, Flower Mound, TX (US); Randolph Henry Zalesak, Arlington, TX (US)

(73) Assignee: Vought Aircraft Industries, Inc., Dallas, TX (US)

( * ) Notice: Subject to any disclaimer, the term of this patent is extended or adjusted under 35 U.S.C. 154(b) by 1577 days.

(21) Appl. No.: 12/428,983

(22) Filed: Apr. 23, 2009

(65) Prior Publication Data

US 2010/0271405 A1   Oct. 28, 2010

(51) Int. Cl.
*G06F 17/50* (2006.01)
*G06G 7/48* (2006.01)

(52) U.S. Cl.
CPC ............ *G06F 17/50* (2013.01); *G06F 17/5086* (2013.01); *G06F 17/5095* (2013.01); *G06F 17/5004* (2013.01)
USPC .................................................. 703/1; 703/7

(58) Field of Classification Search
CPC . G06F 17/50; G06F 17/5004; G06F 17/5086; G06F 17/5095
USPC ......................................................... 703/1, 7
See application file for complete search history.

(56) References Cited

U.S. PATENT DOCUMENTS

| | | | |
|---|---|---|---|
| 5,961,754 A | 10/1999 | Benson | |
| 5,980,085 A | 11/1999 | Vemura et al. | |
| 6,133,922 A * | 10/2000 | Opitz | 345/420 |
| 6,353,768 B1 | 3/2002 | Karafillis et al. | |
| 6,714,900 B1 | 3/2004 | Busse et al. | |
| 6,775,581 B2 * | 8/2004 | Landers et al. | 700/98 |
| 6,996,503 B2 | 2/2006 | Jung | |
| 7,039,569 B1 | 5/2006 | Haws et al. | |
| 7,082,387 B1 | 7/2006 | Wolfe, Jr. | |
| 7,130,708 B2 | 10/2006 | Wang et al. | |
| 7,194,338 B2 | 3/2007 | Schlueter et al. | |
| 7,219,043 B2 | 5/2007 | Rebello et al. | |
| 7,263,674 B2 | 8/2007 | Lorenz | |
| 7,299,165 B1 | 11/2007 | Wan et al. | |
| 7,317,963 B2 * | 1/2008 | Hu et al. | 700/165 |
| 7,421,363 B2 * | 9/2008 | Thomas et al. | 702/113 |
| 7,467,073 B2 | 12/2008 | Nasr et al. | |
| 7,467,074 B2 | 12/2008 | Faruque et al. | |
| 7,472,044 B2 * | 12/2008 | Landers et al. | 703/2 |

(Continued)

OTHER PUBLICATIONS

Delphi Automotive Systems, NPL, "Product/Process Design, using Horizontally structured modeling and virtual machining", 2006.*

(Continued)

*Primary Examiner* — Omar Fernandez Rivas
*Assistant Examiner* — Angel Calle
(74) *Attorney, Agent, or Firm* — Baker Botts L.L.P.

(57) ABSTRACT

In one embodiment, a computer-implemented method for transforming a CAD model of an object between engineering states includes generating a first reference geometry to represent a first engineering state. A parametric CAD model of the object may be generated to represent the object in the first engineering state by constructing the parametric CAD model as having dependence on the first reference geometry. A second reference geometry may be generated to represent a second engineering state. The parametric CAD model may be regenerated to represent the object in the second engineering state by replacing the first reference geometry with the second reference geometry.

15 Claims, 8 Drawing Sheets

(56) References Cited

U.S. PATENT DOCUMENTS

| | | | |
|---|---|---|---|
| 7,526,359 B2 * | 4/2009 | Landers et al. | 700/182 |
| 7,542,889 B2 | 6/2009 | Hillmann et al. | |
| 7,830,377 B1 * | 11/2010 | Desimone et al. | 345/420 |
| 2003/0004596 A1 * | 1/2003 | Landers et al. | 700/98 |
| 2005/0209834 A1 * | 9/2005 | Landers et al. | 703/2 |
| 2006/0106485 A1 * | 5/2006 | Landers et al. | 700/182 |

OTHER PUBLICATIONS

Notification of Transmittal of the International Search Report and the Written Opinion of the International Searching Authority (EPO), or the Declaration; for PCT/US2010/029591; 10 pages, Sep. 15, 2010.

* cited by examiner

METHOD AND SYSTEM FOR TRANSFORMING A CAD MODEL OF AN OBJECT BETWEEN ENGINEERING STATES

TECHNICAL FIELD

The present disclosure relates generally to the field of Computer Aided Design (CAD) and, more particularly, to a method of transforming a CAD model of an object between engineering states.

BACKGROUND OF THE DISCLOSURE

Computer-aided design (CAD) is the use of computer technology to aid in the design and particularly the drafting of a part or product. CAD may be used for design of two-dimensional and three-dimensional models. These CAD models may also provide instructions for the construction of a physical object. For example, a CAD model may specify the dimensions of an object, and a manufacturer may build the object in conformance with these dimensions.

SUMMARY OF THE DISCLOSURE

In one embodiment, a computer-implemented method for transforming a CAD model of an object between engineering states includes generating a first reference geometry to represent a first engineering state. A parametric CAD model of the object may be generated to represent the object in the first engineering state by constructing the parametric CAD model as having dependence on the first reference geometry. A second reference geometry may be generated to represent a second engineering state. The parametric CAD model may be regenerated to represent the object in the second engineering state by replacing the first reference geometry with the second reference geometry.

Certain embodiments may provide numerous technical advantages. For example, a technical advantage of one embodiment may include the capability of a single CAD model to support two or more engineering states. Other technical advantages of other embodiments may include the capability to facilitate rapid switching between two or more engineering states. Yet other technical advantages of other embodiments may include the capability to reduce costs and eliminate errors associated with maintaining two independent CAD models.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

For a more complete understanding of example embodiments of the present invention and its advantages, reference is now made to the following description, taken in conjunction with the accompanying drawings, in which.

DETAILED DESCRIPTION OF EXAMPLE EMBODIMENTS

Figure 1A:
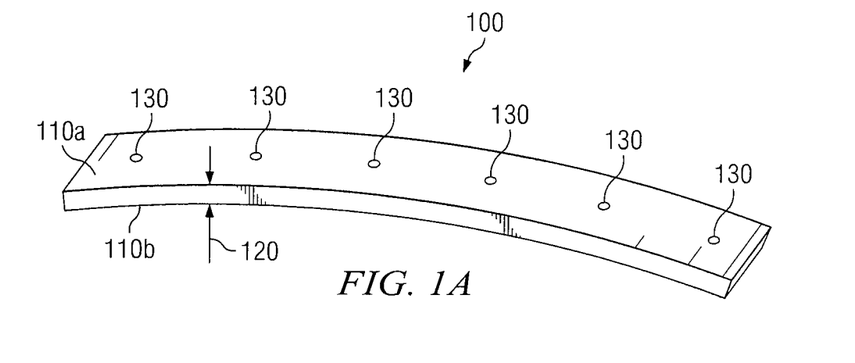
FIG. 1A presents a contoured stringer.

Computer-aided design (CAD) techniques are widely used in the design of various parts and products. However, CAD models may not necessarily provide the most efficient manufacturing instructions. One example is described below in conjunction with FIG. 1A. FIG. 1A illustrates a stringer 100. The stringer 100 may represent any strip of material to which a section of aircraft wing skin may be fastened. Although the example that follows uses the stringer 100 to illustrate example embodiments of the invention, other embodiments may include CAD models of components of any shape or size.

The stringer 100 features a top surface 110a, a bottom surface 110b, and a depth 120. The configuration of the stringer 100 illustrated in FIG. 1A corresponds to a "contoured" condition, meaning that the stringer 100 has been manufactured such that the top surface 110a and the bottom surface 110b have a contoured shape. For example, the contoured shape of the top surface 110a and the bottom surface 110b may correspond to a section of a contoured wing skin.

A designer might use a CAD system to render a three-dimensional model of the stringer 100 in a contoured condition. For example, the designer might draw the top surface 110a and the bottom surface 110b to correspond to the section of a contoured wing skin. The CAD model may include additional features of the stringer 100, such as rivet holes 130.

Manufacturing the stringer 100 in a contoured condition may be more expensive than other manufacturing options. For example, a manufacturer might produce a flat material; make necessary cuts to the flat material to reflect the dimensions of the stringer 100; cut any desired features in the flat material, such as the rivet holes 130; and then shape the flat material to match the contour of the stringer 100, rather than adding the desired features to the stringer 100 after shaping the stringer 100 into the contoured condition.

Figure 1B:
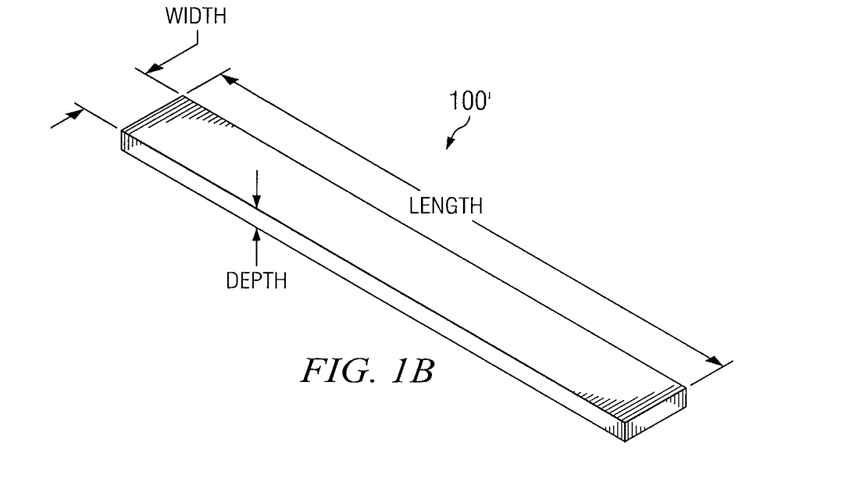
FIG. 1B presents a flat plate representing a flat version of the contoured stringer of FIG. 1A.

Teachings of certain embodiments of the disclosure recognize that manufacturing the material in a flat condition may only require machine motion to be managed in two-dimensions, whereas manufacturing of a material in a contoured condition may require machine motion to be managed in three dimensions. Thus, manufacturers may capitalize on this cost savings by producing a material in a flat condition and then forming the material into a contoured condition. In this example, the material in a flat condition is represented by a plate 100' featuring a length, a width, and a depth, as illustrated in FIG. 1B. The material in a contoured condition is represented by the stringer 100 of FIG. 1A.

Accordingly, manufacturing an object, such as the stringer 100, in a flat condition and then forming the material into a contoured shape may simplify the manufacturing process. However, this approach may require designers to maintain two independent CAD models representing two engineering states: a final engineering model and a manufacturing model. The final engineering model may represent the condition of the object in a final engineering state, after all manufacturing processes are complete. The manufacturing model may represent the condition of the object in a prior manufacturing state, such as prior to forming the flat material to match the contour of the stringer 100. For example, the model illustrated in FIG. 1A may represent the final engineering state of the stringer 100, and the model illustrated in FIG. 1B may represent the manufacturing state of the plate 100'.

Maintaining two independent CAD models, one for the final engineering model and one for the manufacturing model, may increase the time and cost necessary to design an object. In addition, maintaining two independent CAD models increases the risk that synchronization between these two models may not be properly maintained. Every change in one model must be diligently reproduced in the second model, and a discrepancy between models may go undetected. Accordingly, teachings of certain embodiments of the disclosure recognize the use of modeling techniques that enable a single CAD model to support two or more engineering states. Additionally, teachings of certain embodiments recognize that a single CAD model may facilitate rapid switching between two or more engineering states.

Figure 2:
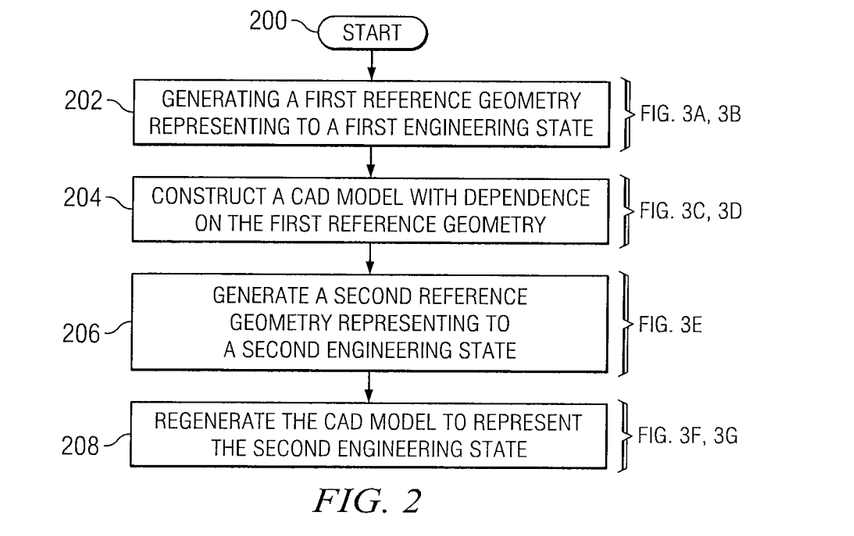
FIG. 2 presents one embodiment of a method for transforming a CAD model of the stringer of FIG. 1A between engineering states.

FIG. 2 presents one embodiment of a method for transforming a CAD model of the stringer 100 between engineering states. FIGS. 3A-3G illustrate embodiments of the method presented by FIG. 2.

The method of FIG. 2 starts at step 200. At step 202, a first reference geometry is generated representing a first engineering state of the object to be modeled. The first engineering state may represent any engineering state of the object. One example of a first engineering state is the final engineering state of the stringer 100, illustrated by FIG. 1A. The first reference geometry may then be defined based on this first engineering state. The first reference geometry may represent any base geometry upon which a parametric CAD model may be constructed.

Figure 3A:
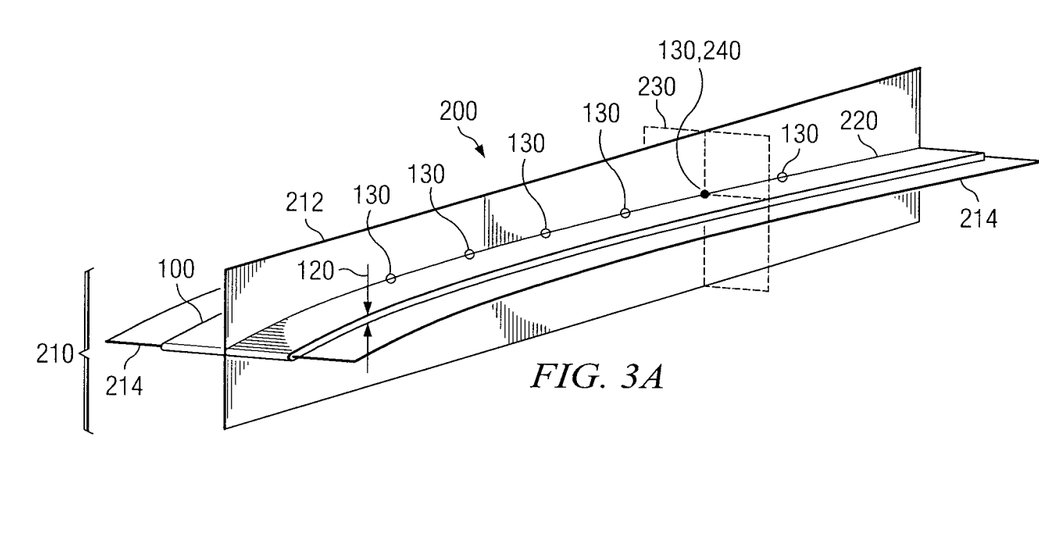
FIGS. 3A-3G illustrate embodiments of the method presented by FIG. 2.

For example, FIG. 3A shows a CAD Model 200 of the stringer 100. The CAD Model 200 defines the stringer 100 relative to a first reference geometry 210. In an effort to simplify the illustrations presented in FIGS. 3B-3G, the stringer 100 is omitted.

In FIG. 3A, the first reference geometry is defined by master surfaces 212 and 214. In the embodiment illustrated in FIG. 3A, the master surface 214 represents a curvature corresponding to the curvature of the stringer 100. However, embodiments of reference geometry 210 may include any spatial elements against which reference measurements may be calculated. For example, the master surfaces 212 and 214 may be planar surfaces; in other embodiments, the master surfaces 212 and 214 may be contoured surfaces. In some embodiments, reference geometry 210 may include geometric elements in place of or in addition to the master surfaces 212 and 214.

A reference plane 230 is illustrated in FIG. 3A. The reference plane 230 serves at least two purposes recognized by certain embodiments of the method illustrated in FIG. 2. First, the reference plane 230 may provide a fixed frame of reference for measuring changes to the CAD Model 200. One example of use of the reference plane 230 as a fixed frame of reference is provided in the discussion accompanying steps 204 through 208.

Figure 3B:
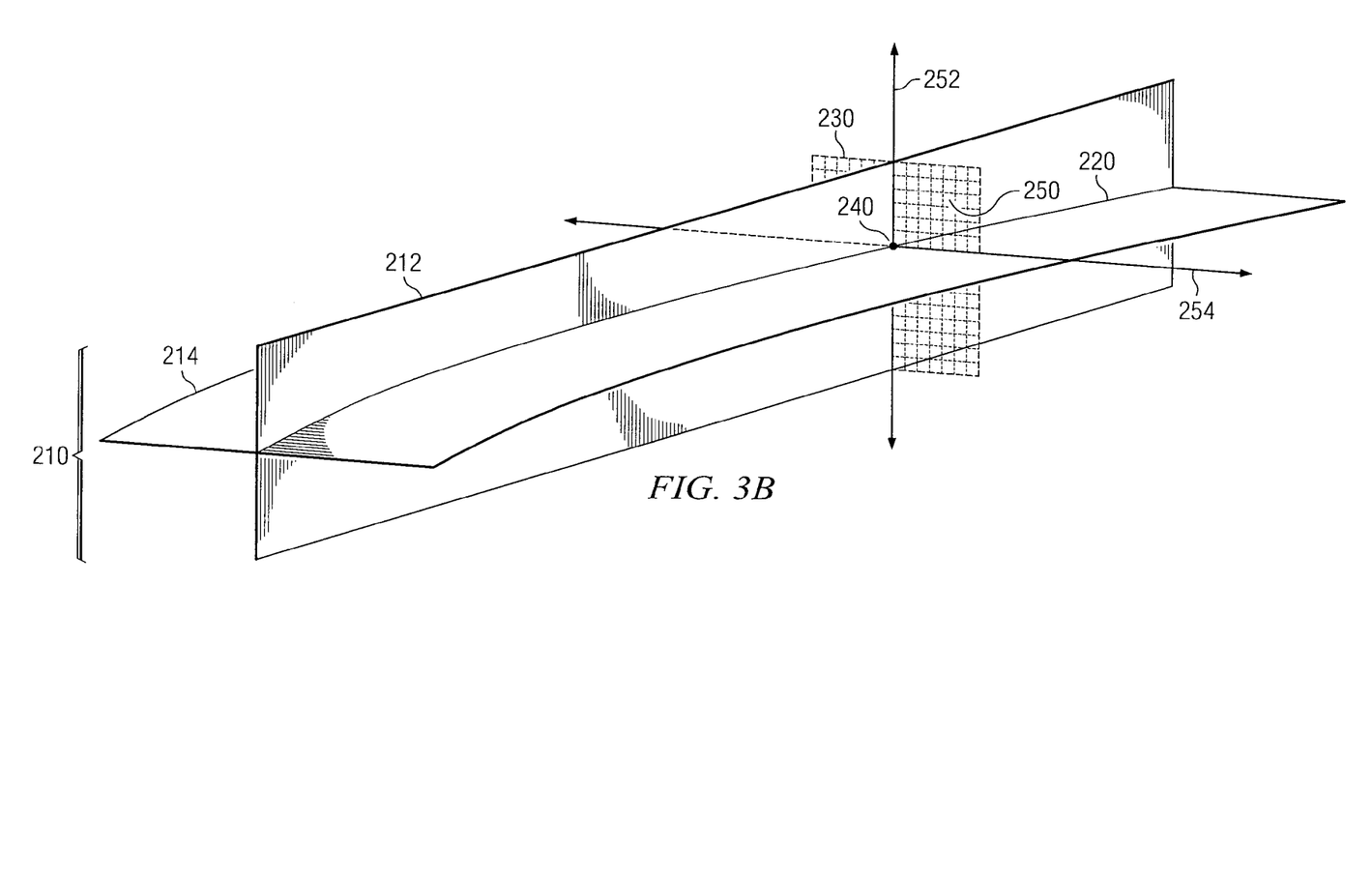
Figure 3C:
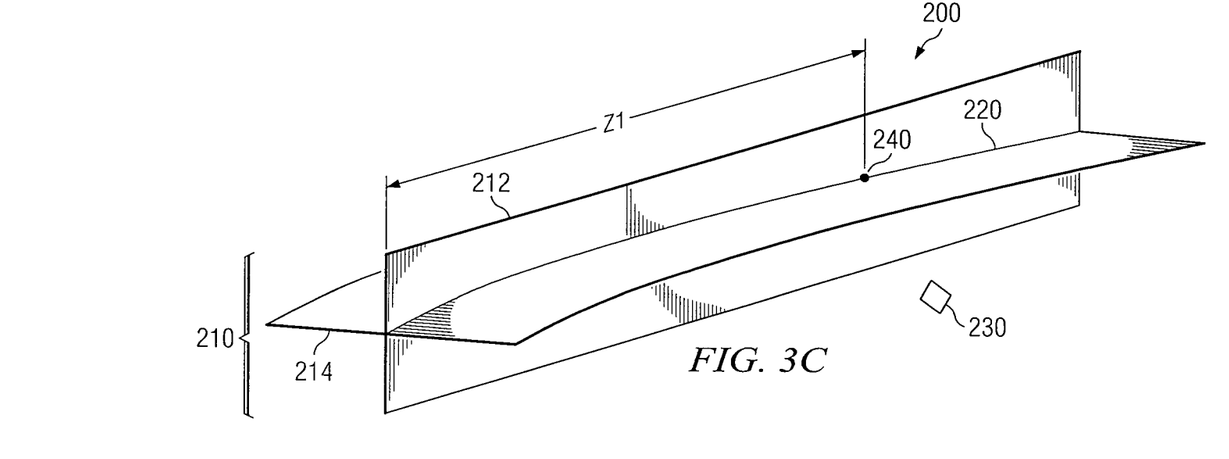

Second, the reference plane 230 establishes a reference coordinate system 250 at an intersection point 240, as illustrated in FIG. 3B. The master surfaces 212 and 214 intersect to form a reference curve 220. The reference curve 220 may act as a "yard stick" against which measurements are calculated. The reference plane 230 intersects the reference curve 220 to form the intersection point 240. The reference plane 230 intersects the master surfaces 212 and 214 and forms a line 252 and a line 254. The line 252 is tangent to the master surface 212, and the line 254 is tangent to the master surface 214. The lines 252 and 254, together with the reference curve 220, form the reference coordinate system 250 centered at the point 240. Although the reference coordinate system 250 may not necessarily be orthogonal, the reference coordinate system 250 may be labeled as a Cartesian coordinate system by analogy. The line 254 may be labeled as the X-axis, the line 252 may be labeled as the Y-Axis, the reference curve 220 may be labeled as the Z-Axis, and the intersection point 240 may be labeled as the origin.

FIGS. 3A and 3B illustrate the reference plane 230 as a flat plane; however, reference plane 230 may be contoured as well. In an effort to simplify the illustrations presented in FIGS. 3C-3G, the reference plane 230 is drawn as a generic geometric element.

At step 204, a parametric CAD model of the object is constructed with dependence on the reference geometry 210. Parametric modeling techniques allow a designer to define a CAD model using parameters, such as dimensions from a reference coordinate system. Thus, a CAD model is dependent on reference geometry when the dimensions defining the CAD model are measured from the reference geometry. In this way, the reference geometry may be considered a "parent," and the CAD model may be considered a "child" dependent on the parent. Therefore, a child, by definition, is defined as derived from a parent with dependence on the parent.

In the current example, the stringer 100 may be defined based on dimensions measured from reference geometry 210 created at step 202. For instance, the top surface 110a may be defined as existing on the master surface 214 and featuring the curvature of the master surface 214. The bottom surface 110b may then be defined as featuring the curvature of the master surface 214 but existing a specified distance from the master surface 214. This specified distance would correspond to the depth 120 illustrated in FIG. 1A.

The reference plane 230 may establish a fixed frame of reference set to correspond to certain features on the stringer 100. For example, the stringer 100 features a line of rivet holes 130. The CAD model may be constructed such that the intersection point 240 overlaps one of the rivet holes 130, as illustrated in FIG. 3A. For example, if the line of rivet holes 130 is situated along the reference curve 220, then the reference plane 230 may be positioned such that it intersects one of the rivet holes 130 at the intersection point 240.

Figure 3D:
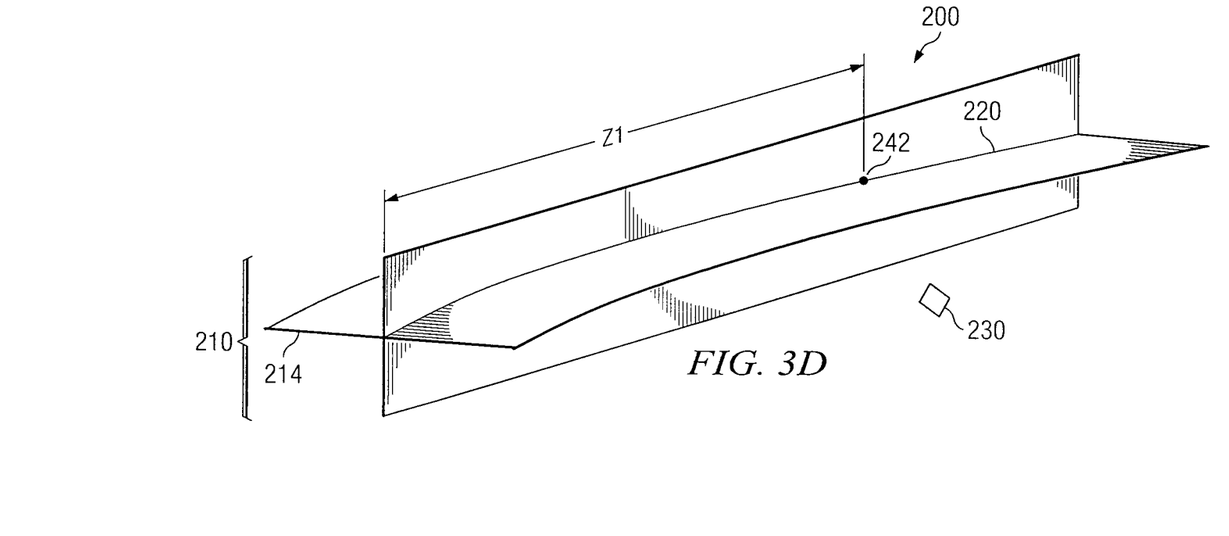

The intersection point 240 is created by intersecting the reference plane 230 with the reference curve 220. In the embodiment shown in FIG. 3C, the intersection point 240 is a distance Z1 from the end of the reference curve 220. In FIG. 3D, a new point 242 is placed at the same point as intersection point 240. The point 242 is defined as a point on reference curve 220, located the distance Z1 from the end of the reference curve 220. Thus, using the modeling techniques described in this embodiment, the new point 242 is independent of the plane 230. The new point 242 is a descendent of only the master surfaces 212 and 214, whereas the intersection point 240 is a descendent of the master surfaces 212 and 214 and the reference plane 230.

Although the illustrated embodiment measures the location of the points 240 and 242 from the end of the reference curve 220, other embodiments may measure the location of the points 240 and 242 from any other suitable reference point.

At step 206, a second reference geometry 210' is generated representing a second engineering state. The second engineering state may represent any engineering state of the object. One example of a second engineering state is the manufacturing state of the plate 100', illustrated by FIG. 1B. The second reference geometry 210' may be defined based on this second engineering state. The second reference geometry may represent any base geometry upon which a parametric CAD model may be constructed.

Figure 3E:
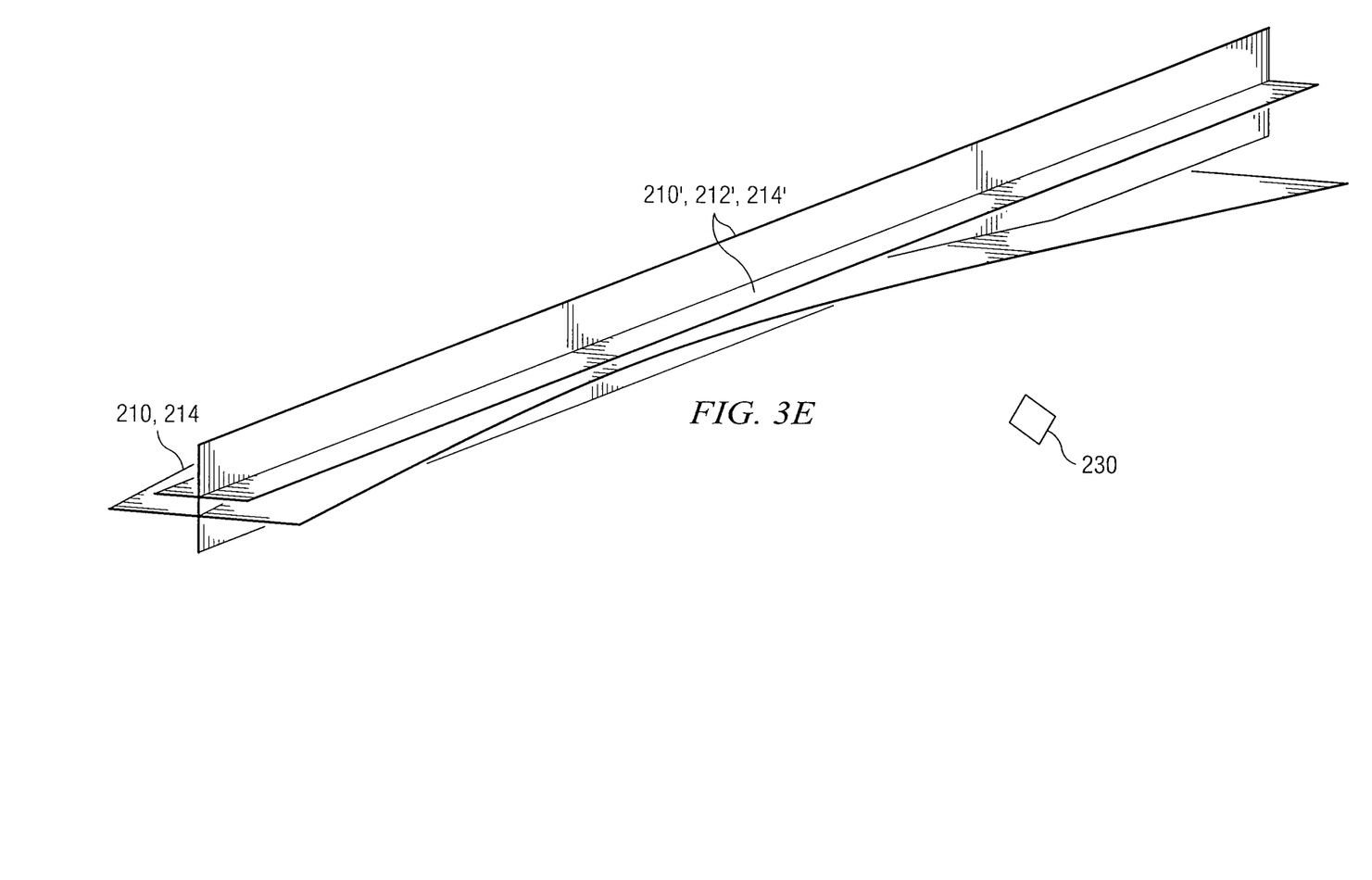
Figure 3F:
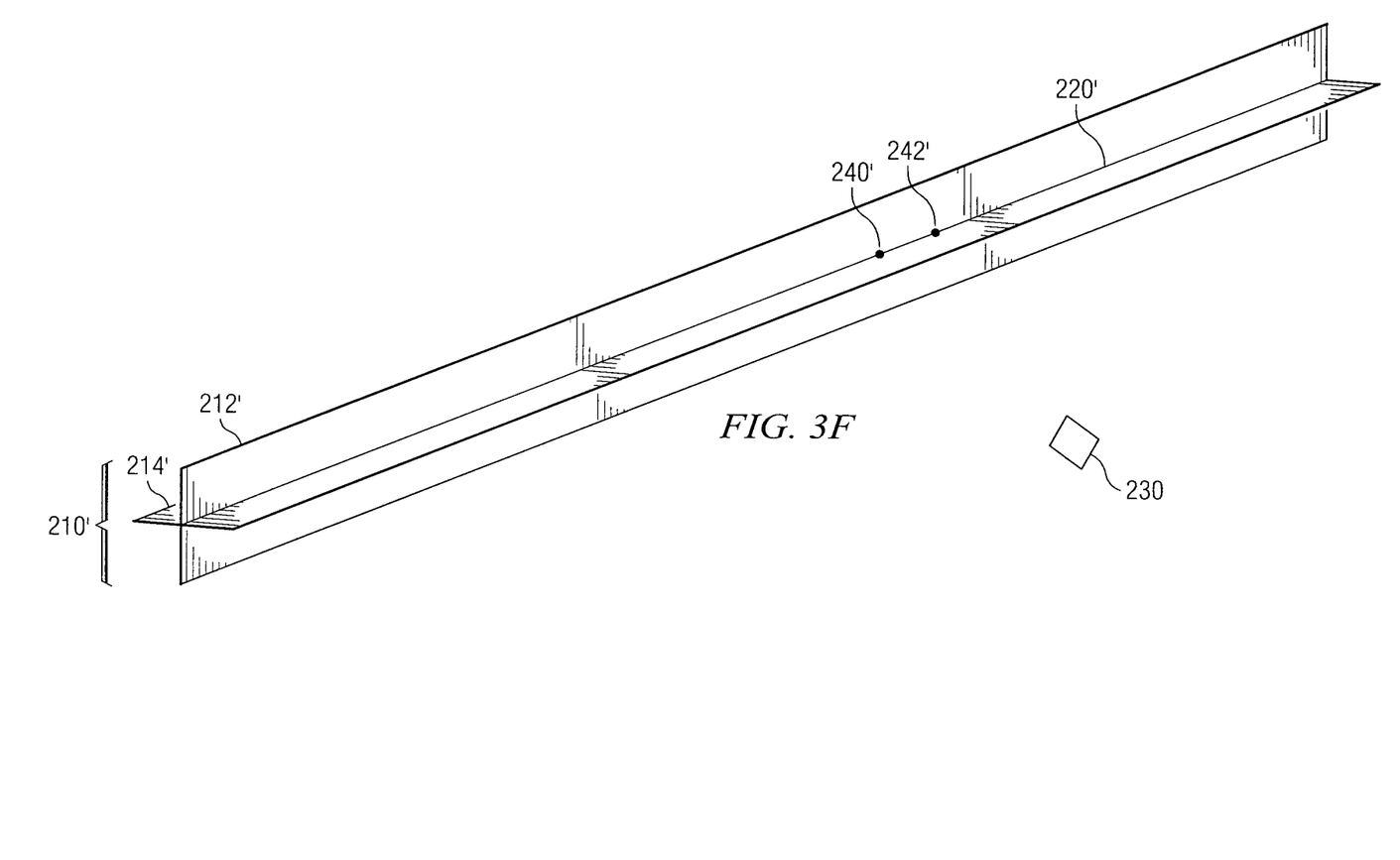

In the embodiment of the second reference geometry 210' shown in FIG. 3E, reference geometry 210' is defined by master surfaces 212' and 214'. In this example, the master surface 214' is flatter than the master surface 214 because the master surface 214' represents the material in the flat condition, similar to the manufacturing state illustrated in FIG. 1B. The master surfaces 212' and 214' intersect to form a reference curve 220'. The reference plane 230 may intersect the reference curve 220' at an intersection point 240', as shown in FIG. 3F.

Embodiments of the reference geometry 210' are not limited to a "flat" condition, but may include reference geometry and spatial elements of any shape and size. Embodiments of reference geometry 210' may include any spatial elements against which reference measurements may be calculated. For example, the master surfaces 212' and 214' may be planar surfaces. However, in other embodiments, the master surfaces 212' and 214' may be contoured surfaces. In some embodiments, for example, the master surfaces 212' and 214' may be similar in shape and size to the master surfaces 212 and 214 but with limited contour. In some embodiments, reference geometry 210' may include geometric elements in place of or in addition to the master surfaces 212' and 214'.

At step 208, the CAD model is regenerated to represent the object in the second engineering state by replacing the reference geometry 210 with the reference geometry 210'. In FIG. 3F, the master surface 212' replaces the master surface 212, and the master surface 214' replaces the master surface 214. The step of replacing the reference geometry 210 with the reference geometry 210' may include the steps of inserting the reference geometry 210' into the parametric CAD model, regenerating any children of the reference geometry 210 as children of the reference geometry 210', and, if desired, removing the reference geometry 210 from the parametric CAD model. The step of replacing the reference geometry 210 with the reference geometry 210' may be performed by a general purpose computer, such as the general purpose computer 10 presented in FIG. 4A.

When the reference geometry 210 replaces the reference geometry 210', any children of the reference geometry 210 are regenerated as children of the reference geometry 210'. For example, the reference curve 220, which is defined as a child of the parent master surfaces 212 and 214, becomes the reference curve 220', which is defined as a child of the parent master surfaces 212' and 214'. Thus, the reference curves 220 and 220' may be characterized as the same curve but with different parents.

The top surface 110a, defined as existing on the master surface 214 and featuring the curvature of the master surface 214, now exists on the master surface 214' and features the curvature of the master surface 214'. The bottom surface 110b now features the curvature of the master surface 214' and exists at a depth 120 from the master surface 214'. Thus, the contoured stringer 100 of FIG. 1A now resembles the flat plate 100' of FIG. 1B.

In this example, the stringer 100 is modeled as a child of only the reference geometry 210 and is prohibited from depending on other geometric elements. Any geometrical element created downstream from the parent reference geometry 210 may be prohibited from directly referencing other geometric elements. Thus, when the reference geometry 210' replaces the reference geometry 210 at step 208, the stringer 100 may be properly defined as a child of the reference geometry 210'.

Figure 3G:
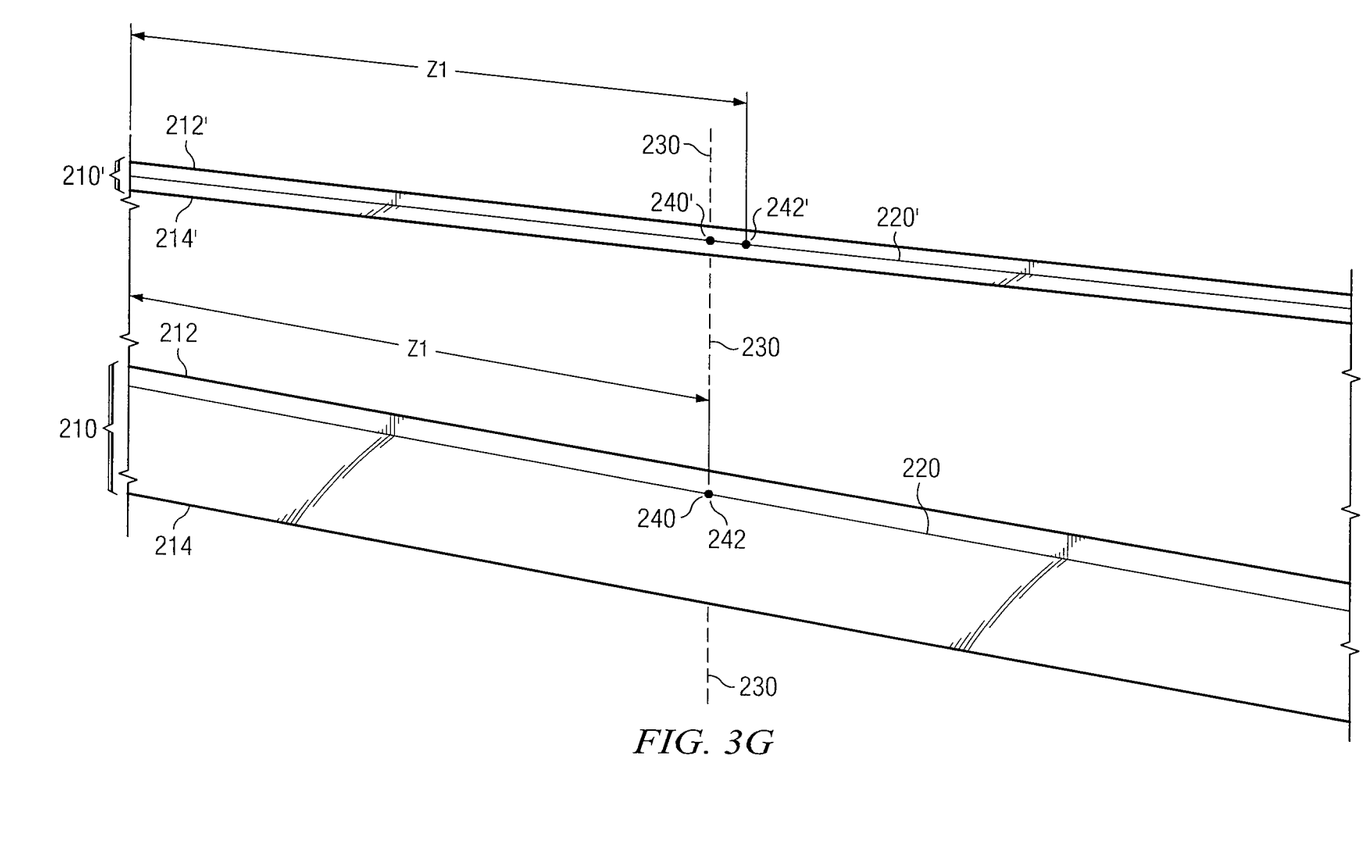

FIG. 3G shows an overlay of both the first engineering geometry 210 and the second engineering geometry 210'. In FIG. 3G, a new point 242' is defined as a point on the reference curve 220' that is the distance Z1 from the end of the reference curve 220'. The point 242, which is defined as a child of the parent master surfaces 212 and 214, becomes the point 242', which is defined as a child of the parent master surfaces 212' and 214'. Thus, the points 242 and 242' may be characterized as the same point but with different versions of the same parents.

Unlike the point 242 and the intersection point 240 on reference curve 220, the point 242' is not in the same position as the intersection point 240'. This result occurs because the reference curve 220' is flatter than the reference curve 220.

Thus, steps 202 through 208 have produced a single CAD Model that represents two engineering states of an object. In this example, the CAD Model produced by step 204 represents the stringer 100 in the final engineering state. The CAD Model produced by step 208 represents the plate 100' in the manufacturing state. The final engineering state and the manufacturing state of the stringer 100 are automatically synchronized through the steps described in FIG. 2.

The manufacturing model produced by step 208, which has dependence on the second reference geometry 210', may be used by a manufacturer to produce the stringer 100. For example, the manufacturer could produce a flat material such as plate 100' and cut the flat material to the dimensions specified by the CAD Model produced by step 208. The manufacturer could then shape the flat material into the contoured condition specified by the final engineering model to produce the stringer 100.

In some embodiments, the general purpose computer 10 may aid in the execution of one or more of the steps 202 through 208. For example, interchanging the reference geometry 210' with the reference geometry 210 may be accomplished using a replace function programmed into a CAD engine. Additionally, some embodiments may include the capability to "toggle" between the reference geometry 210 and the reference geometry 210'. For example, an application 30 performing a method for transforming a CAD model of an object between engineering states may facilitate rapid switching between two engineering states.

Figure 4A:
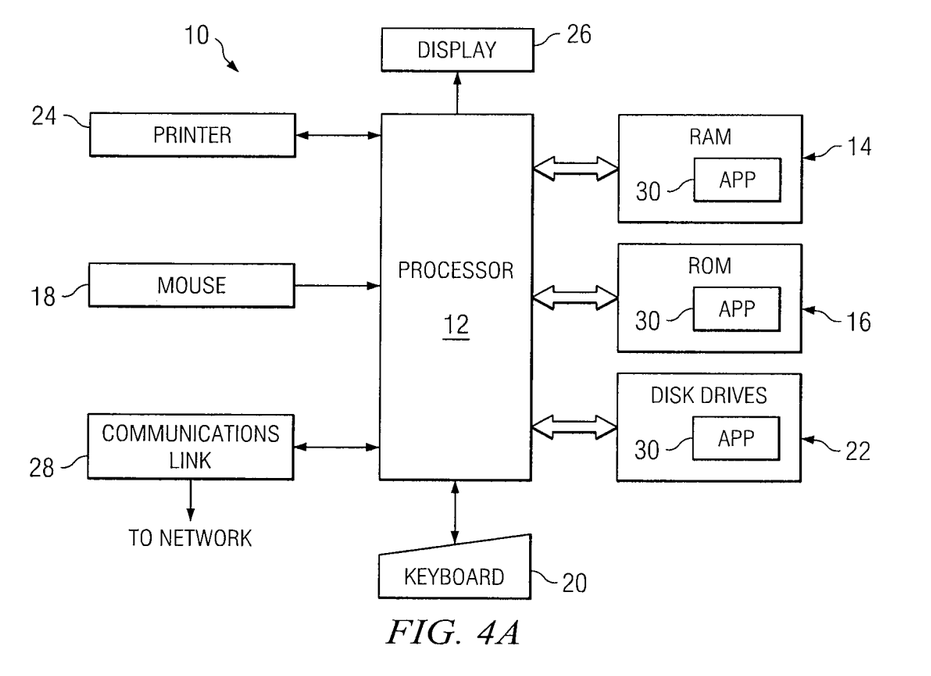
FIG. 4A is an embodiment of a general purpose computer that may be used in connection with one or more pieces of software employed by embodiments of the disclosure.

FIG. 4A presents an embodiment of the general purpose computer 10 that may be used in connection with one applications 30 employed by embodiments of the disclosure. For example, application 30 may include code operable to perform one or more steps towards transforming a CAD model of an object between engineering states. General purpose computer 10 may generally be adapted to execute any of the well-known OS2, UNIX, Mac-OS, Linux, and Windows Operating Systems or other operating systems. The general purpose computer 10 in this embodiment comprises a processor 12, a random access memory (RAM) 14, a read only memory (ROM) 16, a mouse 18, a keyboard 20 and input/output devices such as a printer 24, disk drives 22, a display 26 and a communications link 28. In other embodiments, the general purpose computer 10 may include more, less, or other object parts. Embodiments may include programs that may be stored in the RAM 14, the ROM 16 or the disk drives 22 and may be executed by the processor 12. The communications link 28 may be connected to a computer network or a variety of other communicative platforms including, but not limited to, a public or private data network; a local area network (LAN); a metropolitan area network (MAN); a wide area network (WAN); a wireline or wireless network; a local, regional, or global communication network; an optical network; a satellite network; an enterprise intranet; other suitable communication links; or any combination of the preceding. Disk drives 22 may include a variety of types of storage media such as, for example, floppy disk drives, hard disk drives, CD ROM drives, DVD ROM drives, magnetic tape drives or other suitable storage media. Although this embodiment employs a plurality of disk drives 22, a single disk drive 22 may be used without departing from the scope of the invention.

Although FIG. 4A provides one embodiment of a computer that may be used with other embodiments of the invention, such other embodiments may additionally utilize computers other than general purpose computers as well as general purpose computers without conventional operating systems. Additionally, embodiments may also employ multiple general purpose computers 10 or other computers networked together in a computer network. Most commonly, multiple general purpose computers 10 or other computers may be networked through the Internet and/or in a client server network. Embodiments may also be used with a combination of separate computer networks each linked together by a private or a public network.

Several embodiments may include logic contained within a medium. In the embodiment of FIG. 4A, the logic comprises application 30 executable on the general purpose computer 10. The logic may be stored on a medium such as the RAM 14, the ROM 16 or the disk drives 22. In other embodiments, the logic may be contained within hardware configuration or a combination of software and hardware configurations. The logic may also be embedded within any other suitable medium without departing from the scope of the invention.

Figure 4B:
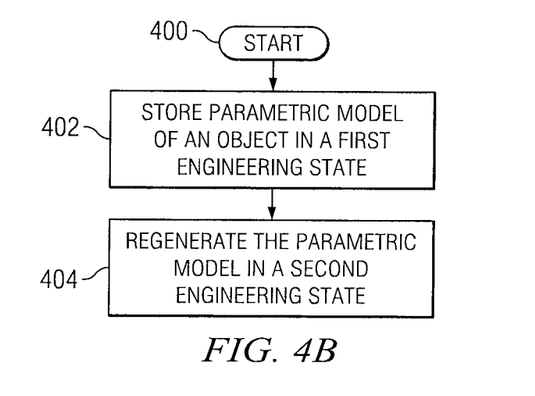
FIG. 4B presents one embodiment of a method for transforming a CAD model of the stringer of FIG. 1A between engineering states using one or more applications.

FIG. 4B presents one embodiment of a method for transforming a CAD model of the stringer 100 between engineering states using one or more applications 30. The method starts at step 400. At step 402, a parametric CAD model of an object is stored. The parametric CAD model representing the object in a first engineering state, and the first engineering state is represented by a first reference geometry 210. The parametric CAD Model is dependent on the first reference geometry 210.

At step 404, the parametric CAD model is regenerated to represent the object in a second engineering state. A second reference geometry 210' replaces the first reference geometry. The second reference geometry 210' represents the second engineering state. The step of replacing the reference geometry 210 with the reference geometry 210' may include the steps of inserting the reference geometry 210' into the parametric CAD model and regenerating any children of the reference geometry 210 as children of the reference geometry 210'. In some embodiments, the reference geometry 210 may be removed from the parametric CAD model; in other embodiments, the reference geometry 210 may be retained within the parametric CAD model.

In some embodiments, the second reference geometry 210' may be generated in an off-line CAD file, and the step of replacing the reference geometry 210 with the reference geometry 210' may include the step of importing the reference geometry 210' from the off-line CAD file into the parametric CAD model. In other embodiments, the second reference geometry 210' may be generated within the parametric CAD model.

The application 30 performing one or more operations at the step 404 may also include the capability to "toggle" between the reference geometry 210 and the reference geometry 210'. For example, the application 30 may instruct the general purpose computer 10 to "toggle" back to the reference geometry 210 by performing the method of FIG. 4B in reverse.

Although several embodiments have been illustrated and described in detail, it will be recognized that substitutions and alterations are possible without departing from the spirit and scope of the present invention, as defined by the appended claims.

What is claimed is:

1. A computer-implemented method for transforming a CAD model of an object between engineering states, comprising:
   generating a first reference geometry representing a final engineering state of an object, wherein the first reference geometry comprises a first surface and a second surface, the first surface and the second surface intersecting to form a first reference curve;
   constructing a parametric CAD model of the object, the parametric CAD model representing the object in the final engineering state, the parametric CAD model of the object having dependence on the first reference geometry, the parametric CAD model of the object having a top surface both located on the second surface and having, a curvature of the second surface, the parametric CAD model of the object further having a bottom surface both located a first distance from the second surface and having a curvature of the second surface;
   defining a fixed reference point on the first reference curve, the fixed reference point being located a second distance from an end of the first reference curve;
   generating a second reference geometry representing a flat manufacturing state, wherein the second reference geometry comprises a third surface and a fourth surface, the third surface and the fourth surface intersecting to form a second reference curve;
   using a computer system, regenerating the parametric CAD model to represent the object in the flat manufacturing state by:
   inserting the third surface and the fourth surface into the parametric CAD Model;
   replacing the first surface with the third surface and replacing the second surface with the fourth surface; and
   defining the fixed reference point on the second reference curve as being located the second distance from an end of the second reference curve.

2. A computer-implemented method for transforming a CAD model of an object between engineering states, comprising:
   generating a first reference geometry representing a first engineering state; wherein the first reference geometry comprises a first surface and a second surface, the first surface and the second surface intersecting to form a first reference curve;
   constructing a parametric CAD model of an object, the parametric CAD model representing the object in the first engineering state, the parametric CAD model having dependence on the first reference geometry; the parametric CAD model of the object having a top surface both located on the second surface and having a curvature of the second surface, the parametric CAD model of the object further having a bottom surface both located a first distance from the second surface and having a curvature of the second surface;
   defining a fixed reference point on the first reference curve, the fixed reference point being located a second distance from an end of the first reference curve;
   generating a second reference geometry representing a second engineering state, wherein the second reference geometry comprises a third surface and a fourth surface, the third surface and the fourth surface intersecting to form a second reference curve;
using a computer system, regenerating the parametric CAD model to represent the object in the second engineering state by:
inserting the third surface and the fourth surface into the parametric CAD Model;
replacing the first surface with the third surface and replacing the second surface with the fourth surface; and
defining the fixed reference point on the second reference curve as being located the second distance from an end of the second reference curve.

3. The method of claim 2, wherein:
the first engineering state represents a condition of the object in a final engineering state; and
the second engineering state represents a condition of the object in a flat manufacturing state.

4. The method of claim 2, further comprising adjusting a length of the second reference curve to approximate a length of the first reference curve.

5. The method of claim 2, wherein the defining a fixed reference point on the first reference curve further comprises:
determining an intersection between the first reference curve and a reference plane; and
defining the fixed reference point as a point on the reference curve without dependence on the reference plane.

6. The method of claim 2, further comprising:
determining an intersection between the first reference curve and a reference plane; and
identifying a reference coordinate system formed by an intersection of the reference plane and the first surface, an intersection of the reference plane and the second surface, and the first reference curve.

7. The method of claim 2, wherein:
generating a second reference geometry representing a second engineering state comprises generating the second reference geometry in an off-line CAD file; and
importing the second reference geometry into the parametric CAD Model.

8. A non-transitory machine-readable storage medium having logic stored thereon and operable, when executed on a processor, to:
store a parametric CAD model of an object, the parametric CAD model representing the object in a first engineering state, wherein:
a first reference geometry represents the first engineering state wherein the first reference geometry comprises a first surface and a second surface, the first surface and the second surface intersecting to form a first reference curve;, and
the parametric CAD model is dependent on the first reference geometry, the parametric CAD model of the object having a top surface both located on the second surface and having a curvature of the second surface, the parametric CAD model of the object further having a bottom surface both located a first distance from the second surface and having a curvature of the second surface;; and regenerate the parametric CAD model to represent the object in a second engineering state by:
defining a fixed reference point on the first reference curve, the fixed reference point being located a second distance from an end of the first reference curve;
generating a second reference geometry representing the object in the second engineering state, wherein the second reference geometry comprises a third surface and a fourth surface, the third surface and the fourth surface intersecting to form a second reference curve;
inserting the third surface and the fourth surface into the parametric CAD Model;
replacing the first surface with the third surface and replacing the second surface with the fourth surface; and
defining the fixed reference point on the second reference curve as being located the second distance from an end of the second reference curve.

9. The non-transitory machine-readable storage medium of claim 8, wherein:
the first engineering state represents the condition of the object in a final engineering state; and
the second engineering state represents the condition of the object in a flat manufacturing state.

10. The non-transitory machine-readable storage medium of claim 8, wherein the length of the second reference curve is adjusted to approximate the length of the first reference curve.

11. The non-transitory machine-readable storage medium of claim 8, wherein defining a fixed reference point on the first reference curve further comprises:
determining an intersection between the first reference curve and a reference plane; and
defining the fixed reference point as a point on the reference curve without dependence on the reference plane.

12. The non-transitory machine-readable storage medium of claim 8, the logic further operable to toggle between the first reference geometry and the second reference geometry.

13. The non-transitory machine-readable storage medium of claim 8, the logic further operable to regenerate the parametric CAD model to represent the object in the first engineering state by replacing the second reference geometry with the first reference geometry.

14. The non-transitory machine-readable storage medium of claim 8, the logic further operable to:
determine an intersection between the first reference curve and a reference plane; and
identify a reference coordinate system formed by an intersection of the reference plane and the first surface, an intersection of the reference plane and the second surface, and the first reference curve.

15. The non-transitory machine-readable storage medium of claim 8, the logic further operable to import the second reference geometry into the parametric CAD Model from an off-line CAD file.

* * * * *